United States Patent [19]
Jacobson

[11] Patent Number: 5,918,196
[45] Date of Patent: Jun. 29, 1999

[54] VISION SYSTEM FOR ANALYZING SOLID-OF-REVOLUTION RADIUS PROFILE

[75] Inventor: Lowell D. Jacobson, Worcester, Mass.

[73] Assignee: Cognex Corporation, Natick, Mass.

[21] Appl. No.: 08/758,426

[22] Filed: Nov. 29, 1996

[51] Int. Cl.$^6$ .................................................. C30B 15/20
[52] U.S. Cl. ............................................ 702/97; 702/159
[58] Field of Search .................................. 117/13–15, 20, 117/201, 202; 702/94, 97, 150, 152, 153, 157, 158, 159–166

[56] References Cited

U.S. PATENT DOCUMENTS

| | | | |
|---|---|---|---|
| 3,740,563 | 6/1973 | Reichard | 117/15 |
| 4,277,441 | 7/1981 | Sachs | 117/202 |
| 4,519,041 | 5/1985 | Fant et al. | 364/552 |
| 4,587,617 | 5/1986 | Barker et al. | 364/507 |
| 4,618,989 | 10/1986 | Tsukune et al. | 382/203 |
| 4,760,604 | 7/1988 | Cooper et al. | 382/15 |
| 4,832,496 | 5/1989 | Thomas | 356/384 |
| 5,179,419 | 1/1993 | Palmquist et al. | 356/73.1 |
| 5,189,711 | 2/1993 | Weiss et al. | 382/203 |
| 5,426,684 | 6/1995 | Gaborski et al. | 378/62 |
| 5,437,242 | 8/1995 | Hofstetter et al. | 117/14 |
| 5,653,799 | 8/1997 | Fuerhoff | 117/14 |
| 5,734,751 | 3/1998 | Saito | 382/203 |

OTHER PUBLICATIONS

Chiou et al., "A Neural Network–Based Stochastic Active Contour Model (NNS–SNAKE) for Contour Finding of Distinct Features," IEEE Trans. On Image Processing, vol. 4, No. 10, Oct. 1995, pp. 1407–1416.

Jacobson, "Conjoint Image Representation and its Application to Viewpoint Invariant Form Recognition and Optical Flow Estimation," Thesis, University of Minnesota, Feb., 1987, pp. 75–76.

Isys, a Cognex Company, iLearn Classifier, Technical Product Bulletin. No date but considered.

Press et al., *Numerical Recipes in C, The Art of Scientific Computing*, Cambridge University Press, 1988, pp. 290–324.

*Primary Examiner*—John Barlow
*Assistant Examiner*—Craig Steven Miller
*Attorney, Agent, or Firm*—Russ Weinzimmer

[57] ABSTRACT

The invention provides a method for visually monitoring the radius of an item which is rotating about a fixed axis and which has a trackable contour known to lie in a plane normal to the rotation, such as a part turned on a lathe. The present invention can also estimate the cross-sectional diameter of a growing crystal, and the height of the cross-section above the melt surface. In addition, the height and radius of the meniscus at the crystal/melt interface can be tracked by the system of the invention. The present makes it possible to further automate crystal growing processes in a manner that increases manufacturing efficiency, consistency, and overall quality. In general, the invention provides a machine vision method for estimating both a longitudinal position and a radius of a circular cross-sectional feature of a solid of revolution. The method includes the steps of acquiring an image of a circumferential feature of the solid of revolution using a camera having a focal length and disposed at a position characterized by a plurality of position parameters, and then finding a set of points along the image of the circumferential feature. The next step is determining an equation of an ellipse that substantially fits the set of points to provide a plurality of ellipse parameters, and then computing the longitudinal position and the radius of the circular cross-section of the solid of revolution using the focal length, the plurality of position parameters, and the plurality of ellipse parameters.

18 Claims, 8 Drawing Sheets

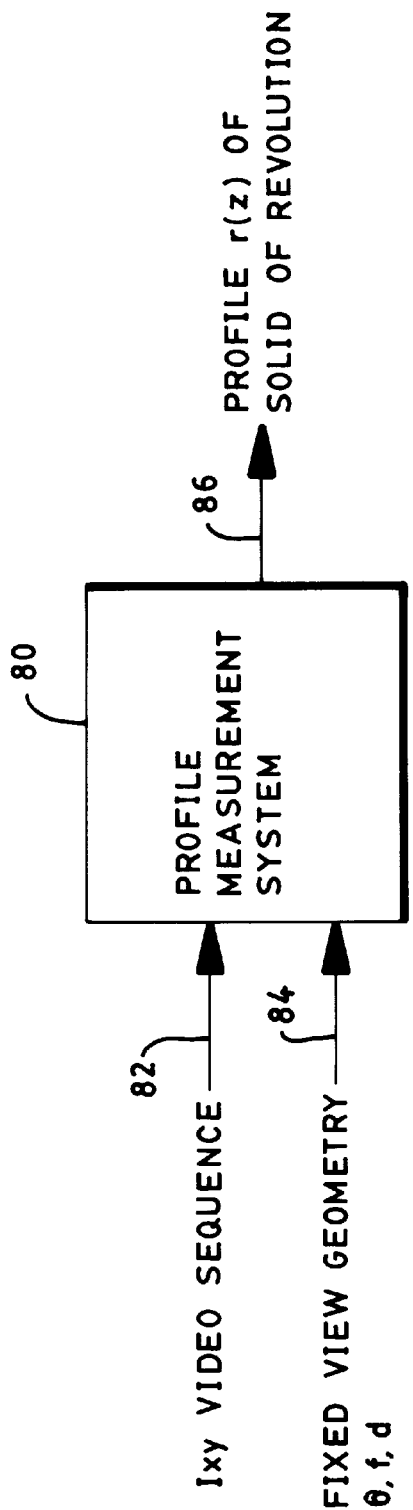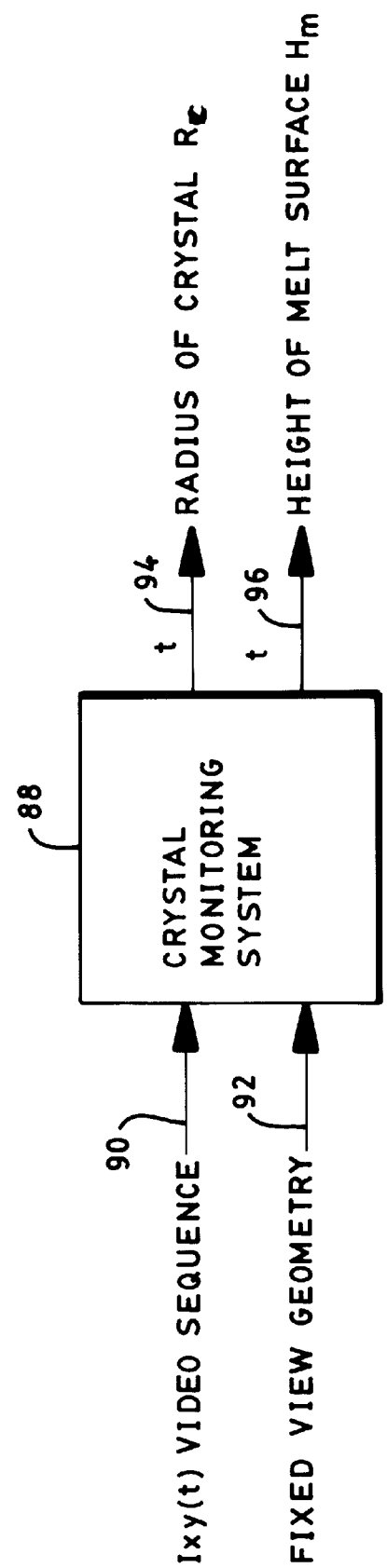

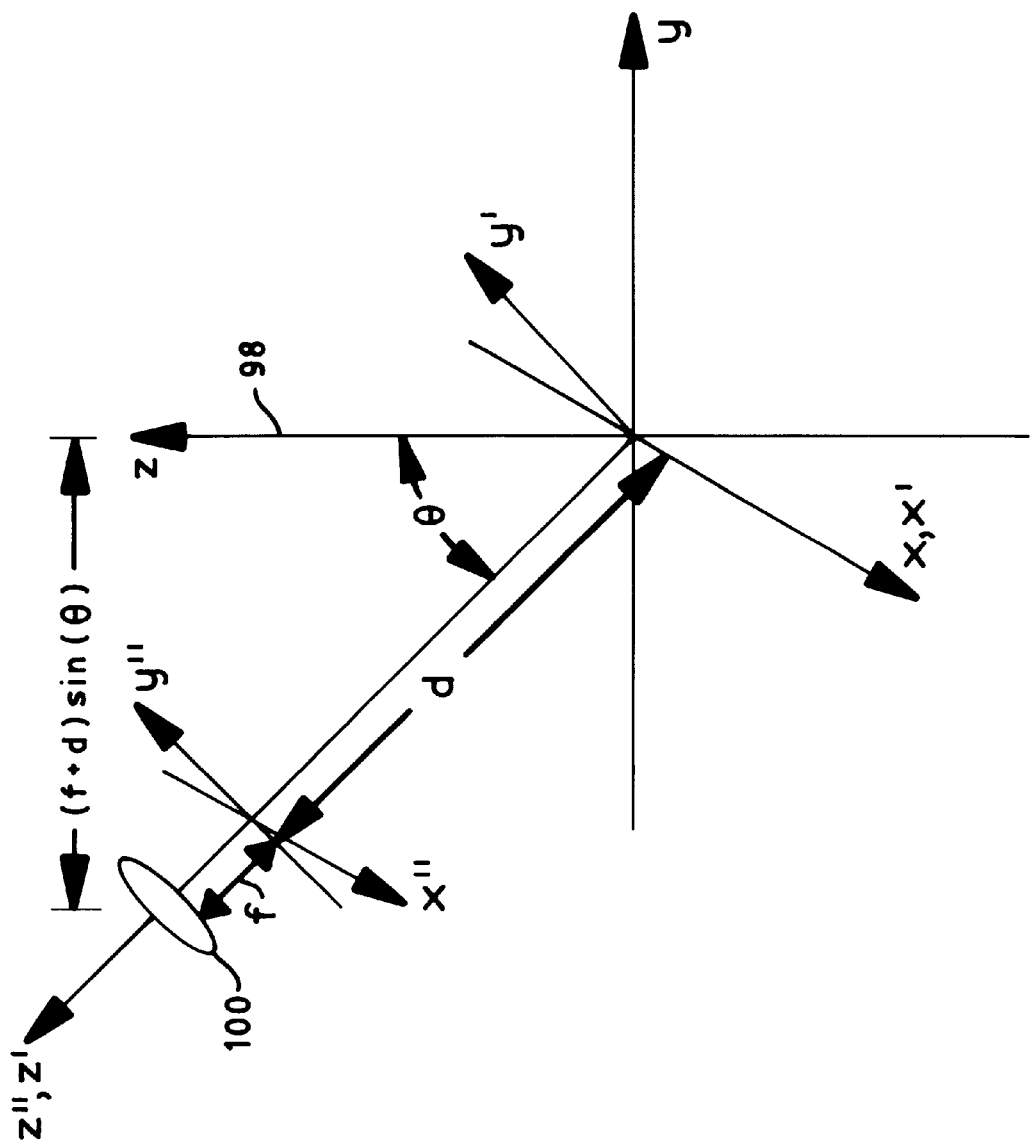

VISION SYSTEM FOR ANALYZING SOLID-OF-REVOLUTION RADIUS PROFILE

FIELD OF THE INVENTION

This invention relates generally to automated manufacturing, and particularly to machine vision for industrial processes.

BACKGROUND OF THE INVENTION

Many manufactured parts are formed by rotating blank stock about a fixed linear axis while adding or subtracting material. The resulting parts are referred to as "solids of revolution." Examples include a clay pot produced on a rotating wheel, a baseball bat shaped on a lathe, or a silicon crystal grown from a rotating seed dipped into a silicon melt. Once a solid of revolution has been formed, it may be used directly as in the case of a baseball bat. Alternatively, it may be used as a template from which copies are made through various means such a plastic or metal casting. Such copies, having been formed without the aid of a rotating axis, will nonetheless also be well described as solids of revolution by virtue of their shape.

A manufactured solid of revolution can be described by its profile which must generally conform to precise dimensional specifications. To ensure that the part conforms, and to avoid wasting material, a measurement of the radial dimension at various points along the axis of the part can be performed as the part is coming into being. This measurement can be performed in a variety of ways. For example, it is common to place a caliper in contact with the part to measure the diameter of the part immediately subsequent to a machining operation as the work progresses.

Each of these measurement methods represents contact-based measurement. However, there are some manufacturing situations where contact-based measurement methods present significant disadvantages. For example, machining operations typically generate an abundance of heat, and consequently, the part becomes quite hot at and near the site on the part where the machining operation is occurring. To this heat is added any frictionally generated heat from moving contact of the lever arm or caliper with the rotating part. Since heat can cause thermal expansion, the resulting dimensional instability of the measurement device can lead to measurement inaccuracy. In other manufacturing situations, the part may be made from a radioactive, chemically active, pressure sensitive, thermally sensitive, or ultra-pure material, and consequently it is desirable to minimize or eliminate any contact with the part. In these and other situations, it can be advantageous to use a non-contacting method for measuring the diameter of a part at various positions along the length of the part, and/or at various times during the manufacturing process.

A common non-contact approach for gauging parts described as solids of revolution involves viewing the object with a camera whose line-of-sight is normal to the object's axis of revolution. The resulting image then directly depicts the part profile. However, in order to obtain an accurate profile image, expensive optics must be used (e.g. telecentric lens) to achieve an image that well approximates an orthographic projection. Furthermore, this approach places strong constraints on camera position and viewing angle which are not always possible to achieve.

An important application where it is necessary to gauge a solid of revolution is in the production of mono-crystalline material used in the manufacture of semiconductor devices. Such crystals are grown in a sealed vacuum chamber to prevent exposure of the molten silicon to reactive gasses such as oxygen which would ruin the crystal. Given the severe conditions within the chamber, it is highly desirable to employ a non-contacting method to measure the dimensions of the crystalline material as it is being manufactured. However, the non-contacting approach described in the previous paragraph, involving orthographic profile projection is not feasible because it is not generally possible to arrange for the camera to view normal to the axis of revolution of the growing crystal. Rather, the camera must view the crystal from a oblique angle determined by the position of a small quartz viewing window built into the vacuum chamber within which the crystal is grown. Under these circumstances, visual gauging methods must be compatible with whatever view of the crystal happens to be available.

The manufacture of crystalline material is an important first step in the production of many products (laser, electronic chips, etc.). One widely used method for growing single large single crystals is known as "high temperature Czochralski crystal growth." This method is used, for example, to manufacture large crystals of Gallium Arsenide and Silicon. These crystals are then sliced to provide large wafers for use in the production of electronic chips.

FIG. 1 provides a simplified diagram of a Czochralski crystal growing system. The Czochralski crystal growing method involves lowering a single-crystalline "see crystal" 10 until it touches the surface of a high temperature melt of source material 12. The seed crystal 10 is continuously rotated and slowly pulled upward as material from the melt 12 adds to the length and diameter of the growing crystal. The seed 10, neck 14, crown 16, and body 18 are all parts of the growing crystal. The growing crystal is pulled 32 and rotated 34 via a chuck 20 attached to a cable 22 that is connected to a drive motor 24. The high temperature melt of source material 12 is contained in a crucible 26 that is heated by a heater 28. Gradually, over many hours, a single large crystal with an elongated body 18 is pulled from the melt 12.

To produce high quality crystals, it is necessary to continuously monitor the cross-section of the crystal body 18 where it contacts the melt 12. During early stages of crystal growth, the cross-section of the neck 14 and crown 16 must be similarly monitored. In practice, the crystal/melt contact is often visible as a bright meniscus 30 that extends just above the plane of the melt surface to contact the underside of the growing crystal. The meniscus 30 arises from surface tension and it appears bright because its curved surface strongly reflects light emitted by the hot wall of the crucible 26 used to contain the molten source material. Even when a meniscus is not present, for example during the crown stage of crystal growth, the boundary between crystal and melt is still generally visible as an abrupt change in luminance at the boundary.

The meniscus 30 can be used to estimate the crystal cross-sectional diameter. Known systems for estimating crystal diameter include systems that use a line-scan camera to sense luminance along a one-dimensional cross-section of the scene. The viewing angle of the camera is set to include the crystal and the melt to either side of the crystal. These systems all work by measuring the length of a chord that crosses the elliptical projection of the circular boundary between crystal and melt. By calibrating the relationship between chord length and crystal diameter, such systems have long been used to obtain a time-varying estimate of crystal diameter.

A major limitation of line-scan systems is due to their inability to distinguish between various factors, in addition to crystal diameter, that can cause the measured chord length to vary. These factors include changes in melt level, and changes in crystal position.

Melt level changes occur due to incorporation of molten source material into the solid crystal. The crucible may be gradually raised in an effort to maintain a constant melt level. However, melt level variation ranks as the largest source of error in the diameter estimates produced by line-scan systems.

The crystal position varies because the crystal is suspended by a long cable or rod that continuously rotates, causing the crystal to also rotate. Due to the rotational energy being imparted to the crystal, any minor disturbance tends to cause the crystal to oscillate, or orbit, about the central vertical axis of the puller in a pendulum-like fashion. The amplitude of such oscillations can be larger than the entire diameter of the crystal during the early stages of crystal growth, causing the line scan system to see no only large variations in chord length but also the complete disappearance of the crystal from its one-dimensional view. Therefore, line-scan systems perform badly during the early (neck and crown) stages of crystal growth.

The above limitations of line-scan systems for crystal diameter estimation can be overcome by two-dimensional imaging systems that detect and use the entire boundary defining the crystal/melt interface. Indeed, this interface is a rich source of information which is not fully exploited in existing systems, even when these systems employ a two-dimensional image sensor. For example, on existing system sold by Hamamatsu, requires a one-dimensional cross-section of the image in a manner that mimics the operation of a line-scan camera as describe above.

Another existing system, previously developed by Cognex Corporation, Natick, Ma., the assignee of the present invention, acquires a two-dimensional image from which it estimates the width (in pixels) of the elliptical projection of the crystal meniscus. That Cognex system effectively deals with crystal orbit, but is unable to tell if a change in projection width results from a change in melt level or a true change in crystal diameter.

SUMMARY OF THE INVENTION

The invention provides a machine vision method for estimating both a longitudinal position and a radius of a circular cross-section of a solid of revolution. The method includes the steps of acquiring an image of a circumferential feature of the solid of revolution using a camera having a focal length and disposed at a position characterized by a plurality of position parameters, and then finding a set of points along the image of the circumferential feature. The next step is determining an equation of an ellipse that substantially fits the set of points to provide a plurality of ellipse parameters, and then computing the longitudinal position and the radius of the circular cross-section of the solid of revolution using the focal length, the plurality of position parameters, and the plurality of ellipse parameters. In a preferred embodiment, the step of finding a set of points along the image of the circumferential feature includes the steps of creating a hypothetical ellipse at a location in the image, creating a plurality of edge detection windows, each edge detection window being located so as to include a portion of the hypothetical ellipse. Then, within each edge detection window, an edge is located so as to provide an edge position representing a point along the image of the circumferential feature. In another preferred embodiment, the step of determining an equation of an ellipse that substantially fits the set of points uses the step of minimizing a fitting error using a numerical optimization technique. In a further preferred embodiment, the numerical optimization technique is a technique that minimizes the square of the fitting error. In another preferred embodiment, the step of computing the longitudinal position and the radius of the circular cross-section of the solid of revolution uses only one of the major axis length and the minor axis length. In further preferred embodiments, it is advantageous to repeat the previous steps to provide a plurality of recent longitudinal position values and radius values, and then to average the plurality of recent longitudinal position values and radius values to provide an average recent longitudinal position value and the average recent radius value, periodically reporting the average recent longitudinal position value and the average recent radius value of the solid of revolution. In applications where there are no readily detectable circumferential features, it can be useful to first project structured light onto the surface of the solid of revolution so as to create the circumferential feature.

In another general aspect of the invention, a machine vision method for estimating both a melt level and a radius of a circular cross-section of a growing semiconductor crystal is provided. The method includes the steps of acquiring an image of a circumferential feature of the growing semiconductor crystal using a camera having a focal length and disposed at a position characterized by a plurality of position parameters; finding a set of points along the image of the circumferential feature; determining an equation of an ellipse that substantially fits the set of points to provide a plurality of ellipse parameters; and computing the longitudinal position and the radius of the circular cross-section of the semiconductor crystal using the focal length, the plurality of position parameters, and the plurality of ellipse parameters.

The invention is useful for visually monitoring the diameter of an item which is rotating about a fixed axis and which has a trackable contour known to lie in a plane normal to the rotation axis (for example, machined parts turned on a lathe). If a trackable contour were not directly available on the turning part, one or more contours could be created with structured light.

The present invention can simultaneously estimate the cross-sectional diameter of a crystal, and the height of the melt surface, both in physical length units (e.g. cm). The meniscus at the crystal/melt interface is tracked by the system of the invention. Although the meniscus is essentially circular in the plane of the melt, the images of the meniscus to be processed are perspective projections of the meniscus. The present invention rigorously exploits this geometric perspective distortion.

The present inventions solves the problems of the prior art described above, thereby making it possible to further automate crystal growing processes in a manner that increases manufacturing efficiency, consistency, and overall quality. In particular, the invention provides improved estimates of crystal diameter and melt level that lead to more effective control of the crystal growing process.

BRIEF DESCRIPTION OF THE DRAWINGS

The invention will be more fully understood from the following detailed description, in conjunction with the accompanying figures, wherein:

FIG. 5a and 5b are top-level overviews of system inputs and outputs;

FIG. 6 is a schematic diagram of the camera viewing geometry, where it is assumed that the camera line-of-sight intersects the rotation axis of the crystal puller;

DETAILED DESCRIPTION OF THE FIGURES

Figure 2:
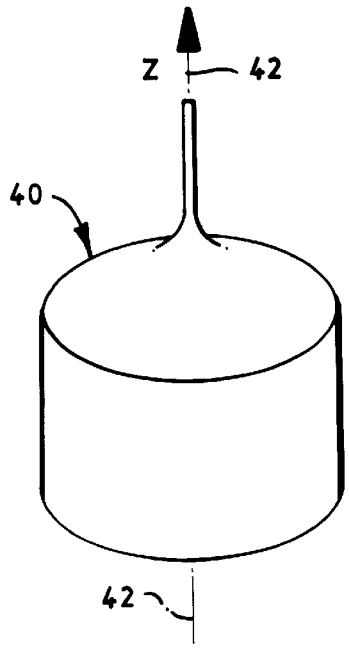
FIG. 2 is a solid of revolution that approximates the shape of a growing crystal in the body growth stage.
Figure 3:
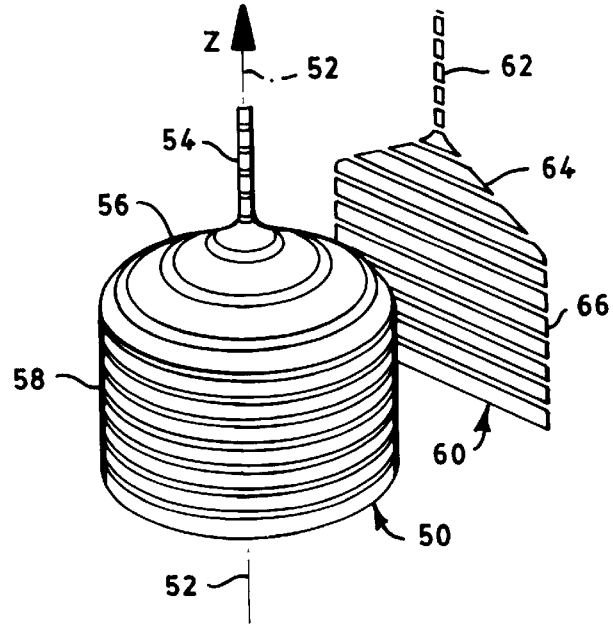
FIG. 3 is a solid of revolution that has been sliced along parallel planes to reveal parallel circles whose diameter varies along the axis of rotation in a manner characterized by an associated projection profile.
Figure 4:
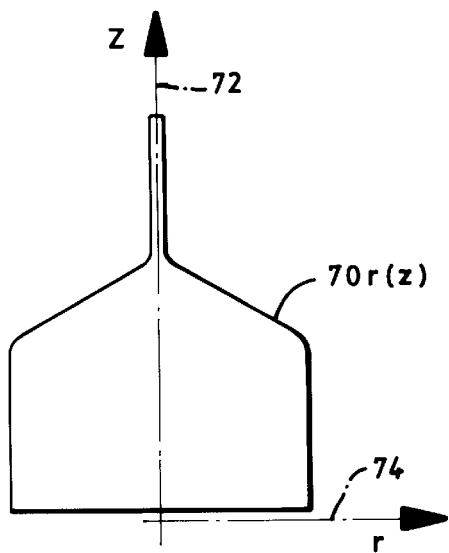
FIG. 4 is a projection profile obtained from the solid of revolution in FIG. 3.

FIG. 2 illustrates a "solid of revolution" 40 with axis of revolution 42. As illustrated in FIG. 3, every plane perpendicular to the axis of rotation 52 of a slid of revolution 50 cuts the object's surface in a parallel circle, e.g. 54, 56, 58. The surface of an object of revolution is therefore covered by an infinite set of parallel circles, where each circle is associated with a distinct position along the axis of rotation. FIG. 3 also illustrates the parallel projection 60 of the solid of revolution 50 in a direction normal to the axis of revolution 52. The projections of the bright circles 54, 56, 58 are seen respectively as lines 62, 64, 66. The length of each of these lines 62, 64, 66 in the plane of projection equals the diameter of the solid of revolution at the corresponding position along the axis of revolution 52. Given the lengths of projection lines at all positions along the axis of revolution 52, we obtain the radius profile plot 70 in FIG. 4, where the radius profile r(z) 70 plots the radius r 74 of the solid of revolution 40 as a function of position z 72 along the axis of revolution 42.

Referring to FIG. 5A, the profile monitoring system 80 of the invention receives a video input sequence $I_{XY}$ 82 from a camera (not shown), and receives a set of fixed view-geometry parameters 84, including viewing angle θ, focal length f of the lens of the camera, and the distance d from the focal point of the lens to the point where the camera axis z' intercepts the object's rotation axis z. The output of the system r(z) 86 is a time-varying estimate of the radius r of the object as a function of position z along the object's axis or rotation.

FIG. 5B is a specialization of the profile monitoring system 80 of FIG. 5A, referred to as the crystal monitoring system 88, which monitors the diameter of a growing crystal. The inputs 90 and fixed view-geometry parameters 92 are identical to those in the general profile monitoring system 80. However, the output consists of two measurements, the radius of the crystal $R_C$ 94 where it contacts the melt, and the height of the melt surface $H_M$ 96 relative to an arbitrary fixed origin. These outputs 94, 96, like the input sequence $I_{XY}$ 90, vary with time.

The viewing geometry of the camera with respect to the solid of revolution 40 is illustrated in FIG. 6. Three coordinate systems are shown including a world coordinate system (x,y,z) having three mutually orthogonal axes, a viewer-centered coordinate system (x',y',z') having three mutually orthogonal axes, and an image-plane coordinate system (x",y",z") having three mutually orthogonal axes. The z-axis 98 in the world coordinate system is assumed to be the axis of revolution (for a crystal, this is also the axis along which the crystal is pulled as it grows). Several constant parameters are also depicted in FIG. 6, including the viewing angle θ, the focal length f of the lens 100, and the distance d. When d is added to f, the result is the distance from the lens 100 to the intersection between the line-of-sight and the z-axis.

Figure 10:
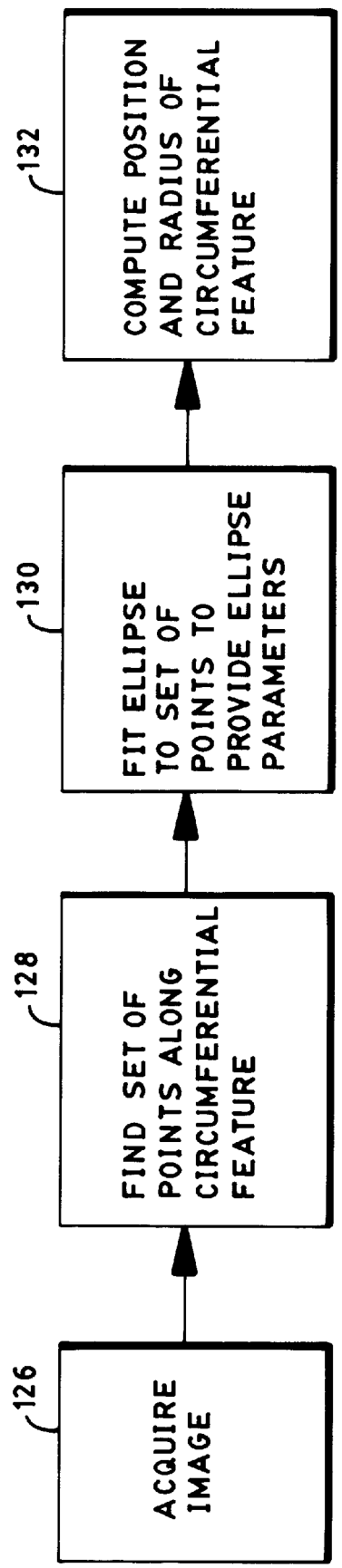
FIG. 10 is a top-level flow chart of the method of the invention.

Referring to FIG. 10, we now describe the method to estimate the position and the radius r of a cross-section of a solid of revolution based on its elliptical projection in an image plane. This method relates the mathematical parameters of the ellipse to those of the circular cross-section of the solid of revolution, and shows how to estimate the latter from the former. The specific methods used to analyze an input image to estimate the parameters of an elliptical projection will be described below.

Figure 8B:
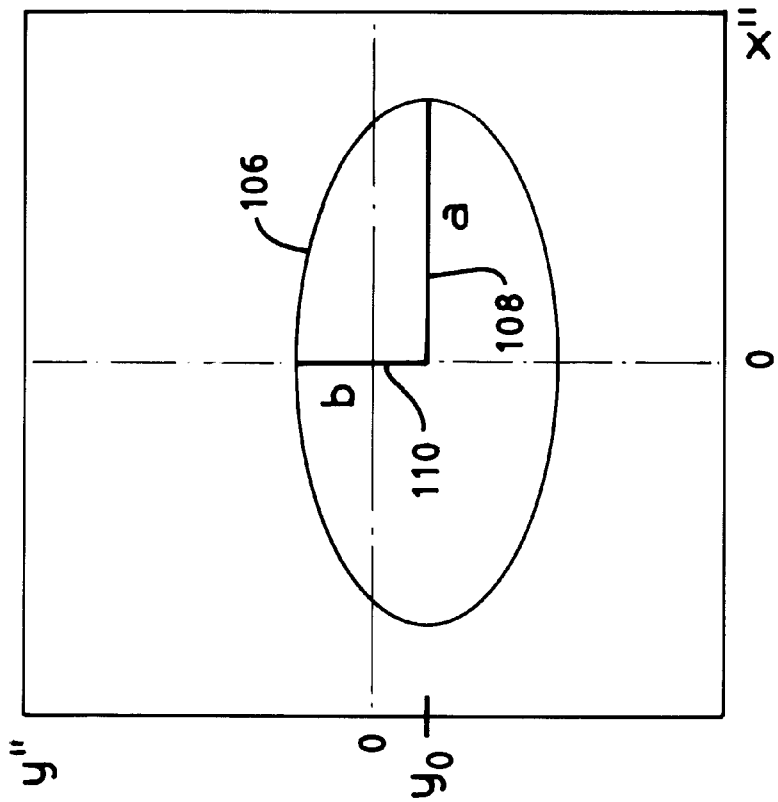
FIG. 8B is an elliptical projection of the circle as seen in the image plane (x", y")
Figure 8A:
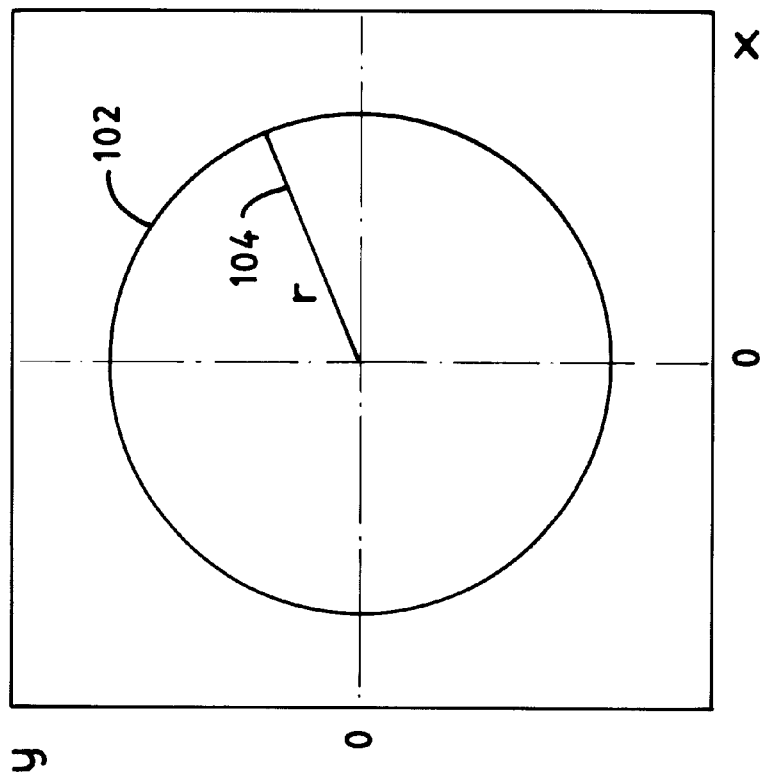
FIG. 8A is an idealized circular meniscus in a melt plane (x, y)

Suppose we are given a circular cross-section 102 of the solid of revolution 40 with radius r 104 as shown FIG. 8A. The circular cross-section 102 is assumed to be at position z along the axis of revolution of the solid of revolution 40. Then, based on the camera geometry described with reference to FIG. 6 above, the image of the circle 102 is obtained by centrally projecting the circle 102 into the image plane (x",y") of FIG. 8B to obtain an ellipse 106.

In terms of the circle radius r 104 and position z and the fixed imaging parameters described with reference to FIG. 6, the major and minor semi-axes 108 and 110 (a and b, respectively), and the vertical location y0 of the ellipse in the image plane (x",y"), are given by the following set of equations:

$$\begin{bmatrix} a \\ b \\ y0 \end{bmatrix} = \begin{bmatrix} \dfrac{f \cdot r}{\sqrt{(z^2 + r^2) \cdot \cos^2(\theta) - 2 \cdot z \cdot (f+d) \cdot \cos(\theta) + (f+d)^2 - r^2}} \\ \dfrac{f \cdot r \cdot [-(f+d) \cdot \cos(\theta) + z]}{(z^2 + r^2) \cdot \cos^2(\theta) - 2 \cdot z \cdot (f+d) \cdot \cos(\theta) + (f+d)^2 - r^2} \\ \dfrac{(r^2 + z^2) \cdot \cos(\theta) - z \cdot (f+d)}{(z^2 + r^2) \cdot \cos^2(\theta) - 2 \cdot z \cdot (f+d) \cdot \cos(\theta) + (f+d)^2 - r^2} \end{bmatrix}$$ (Eq. 1)

This system of equations can be inverted to obtain z and r in terms of a, b, y0, and the other fixed imaging parameters f, d, and θ. Multiple solutions exist, but the following solution is applicable to the present problem.

$$\begin{bmatrix} r \\ z \end{bmatrix} = \qquad\qquad\qquad\qquad\qquad\qquad\qquad\text{(Eq. 2)}$$

$$\frac{(f+d)}{(a^2+f^2)\cdot\sin(\theta)+f\cdot y0\cdot\cos(\theta)} \cdot \begin{bmatrix} a\cdot\sin(\theta)\cdot\sqrt{a^2\cdot\sin^2(\theta)+f^2} \\ f\cdot y0 + a^2\cdot\sin(\theta)\cdot\cos(\theta) \end{bmatrix}$$

Figure 1:
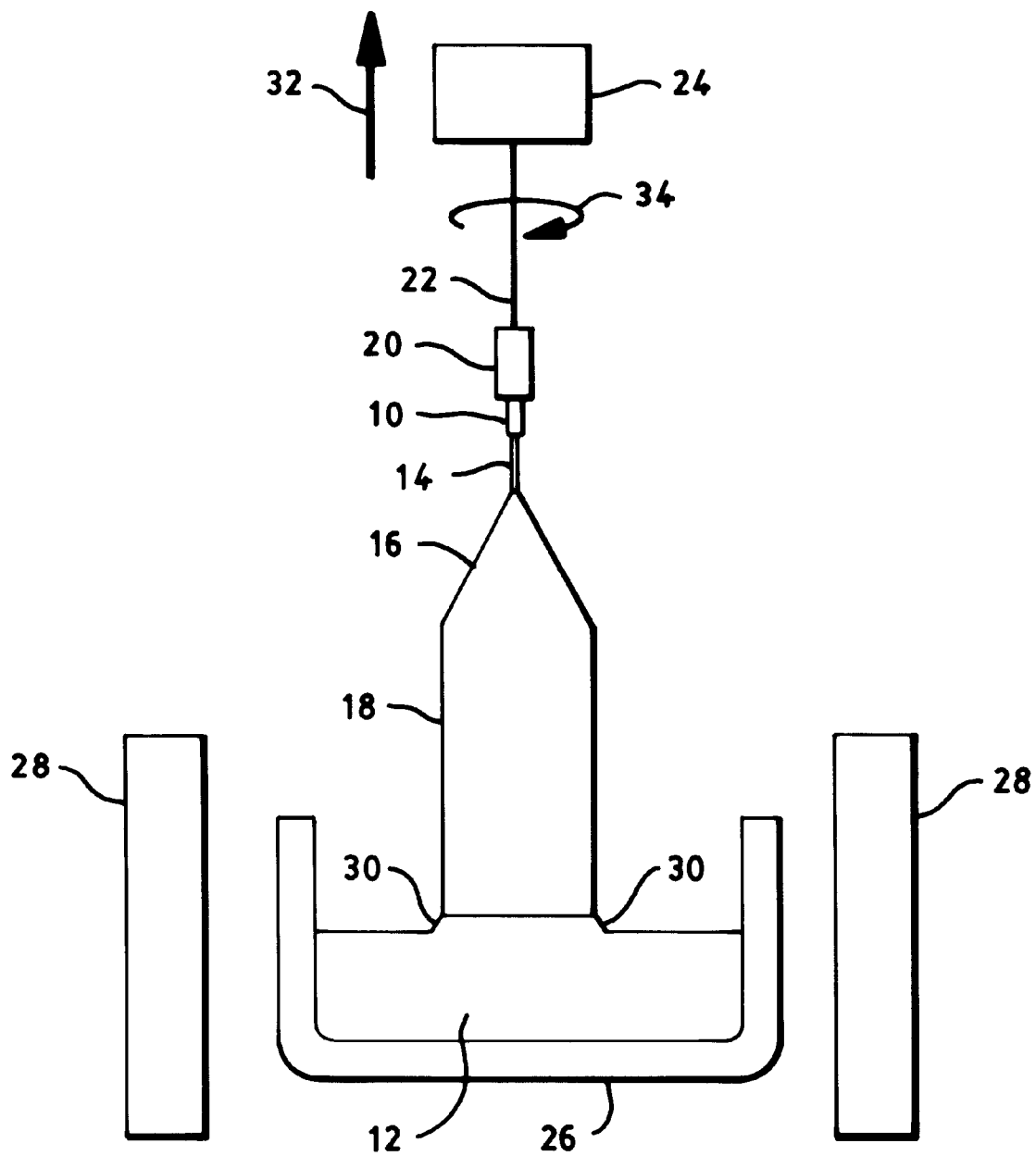
FIG. 1 is a schematic diagram of a Czochralski crystal growing system, wherein the seed, neck, crown, and body are all parts of the growing crystal, and the meniscus at the crystal/melt interface is tracked by the system of the invention.

The above solution (Eq. 2) is used in the radius profile estimation system of the invention to determine the radius r of each visible circular cross-section of the solid of revolution 40 visible in an image, and its associated position z along the axis of revolution. In the crystal monitoring system shown in FIG. 1, the radius Rc is interpreted as the radius r and the height $H_m$ of the crystal where it contacts the melt surface is interpreted as the position z along the axis of revolution. The parameters f, d, and θ are known constants based on the camera geometry as described with reference to FIG. 6. However, the parameters a, b, and y0 describe the elliptical projection of the circular cross-section of the solid of revolution in the image. These parameters must be estimated from images of the part under inspection, such as the bright meniscus 30. The method used by the invention to analyze images to estimate a, b, and y0 is described next.

Figure 9:
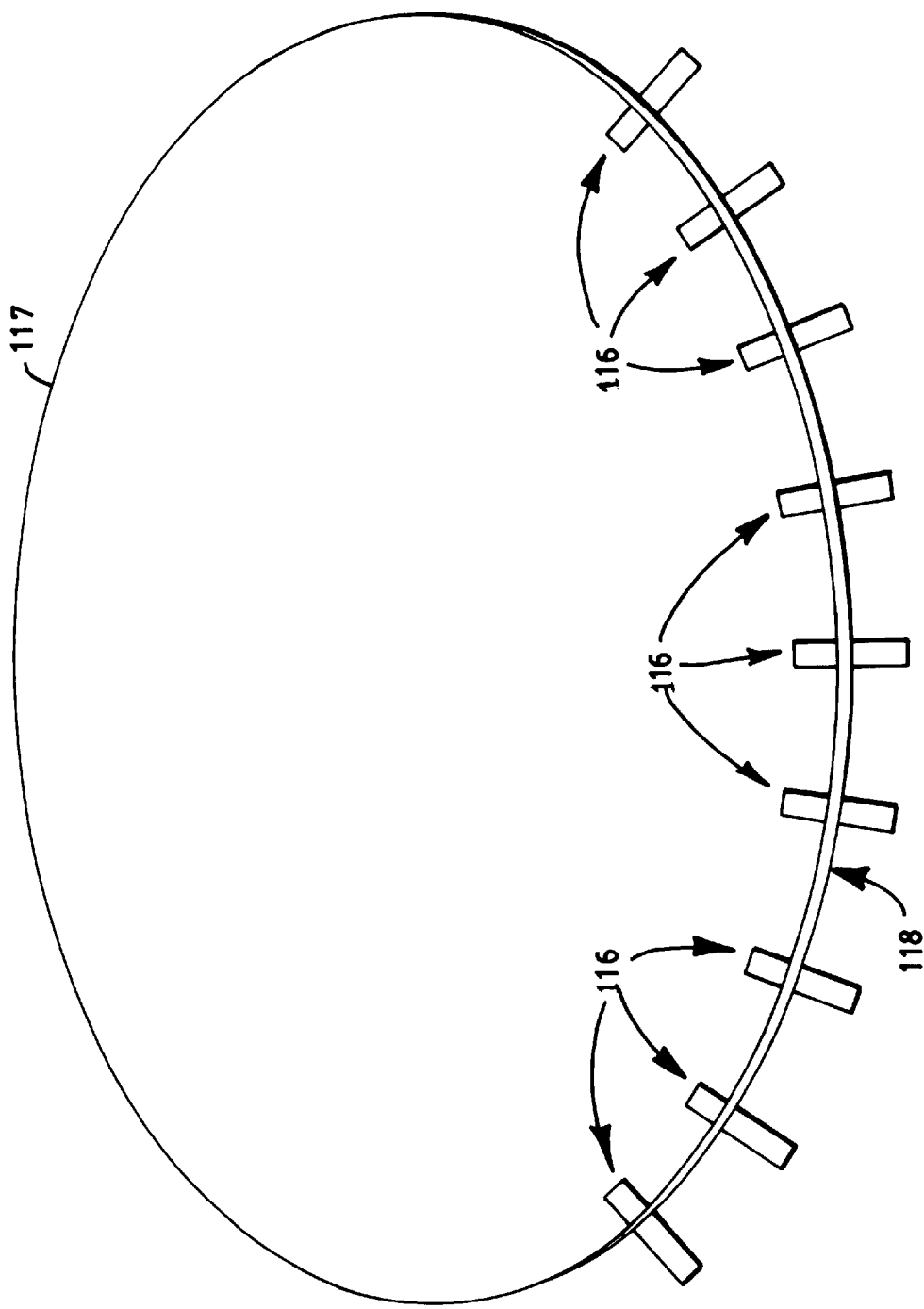
FIG. 9 is an elliptical fit to the elliptical projection of the meniscus of a crystal, where the fit is based on a multiplicity of edge points found by applying edge tools to the image.

Referring to FIG. 9, the estimation of image ellipse parameters begins by generating a hypothetical ellipse estimate 117 in the acquired image of the meniscus 118 with a specific set of parameters (a, b, y0). In general, the image can be of any circumferential feature of a solid of revolution. If no circumferential feature is readily evident on a solid of revolution, structured light can be projected onto the solid of revolution to simulate a circumferential feature.

An ellipse gauging tool, described below, is then applied to the image at the hypothesized position y0 and with the hypothesized major and minor axes a and b, respectively. The ellipse gauging tool consists of a set of edge tools 116 for finding an edge within a designated search window, such as the Edge Tool sold by Cognex Corporation. The edge tools 116 are arranged at intervals around the circumference of the hypothesized ellipse 117. The search direction of each edge tool 116 is normal to the local tangent to the hypothesized ellipse 117.

The arrangement of edge tools 116 is illustrated in FIG. 9 in relation to the elliptical projection of the circumferential feature, such as the meniscus of a growing crystal. As shown in the FIG. 9, the meniscus 118 generally appears as a bright elliptical band in the image. According to standard practice, each edge tool 116 computes the gradient of the image intensity profile along its search direction, and then finds the peak in the resulting gradient profile that satisfies all user-configured parameters such as edge direction. If this peak exceeds a configurable threshold, then the edge tool is judged to have detected an edge and the position of the edge in the 2D image is recorded. Based on the position results from all edge tools 116, the ellipse gauging tool obtains a set of points on the circumference of the visible ellipse 118 in the image. Because each edge tool 116 seeks the strongest edge along its full length, a set of points on the image ellipse 118 is obtained even when the hypothesized ellipse 117 has a slightly different position and size than the ellipse 118 actually present in the image.

In step (130) of FIG. 10, if three or more of the edge tools 116 detect edges in the image, then the ellipse gauging tool uses these points to estimate a best-fitting ellipse in the mean-squared-error sense. In particular, the ellipse fitting procedure finds the parameters (a, b, y0) that minimize the mean squared error between the elliptical fit and the set of edge points. Once the parameters of the best elliptical fit to the set of detected edge points has been derived, this completes the ellipse gauging operation for the current image. The newly estimated ellipse parameters are then used to set the positions and orientations of the tracking edge tools for the next acquired image as described above. Therefore, if the elliptical projection of a circular cross-section of a solid of revolution moves, grows, or changes aspect (defined as the ratio a/b) over time, then the positions and orientations of edge tools 116 will track these changes, enabling the ellipse gauging tool to successfully estimate the parameters (a, b, y0) of the elliptical projection from each successively acquired image.

If fewer than three of the edge tools 116 detect edges in the image, then the ellipse gauging tool is unable to fit an ellipse 117. It is therefore necessary to hypothesize a new set of ellipse parameters and then apply the ellipse gauging tool using the new ellipse position and size. This hypothesis-test procedure continues until the ellipse gauging tool is successful.

Various methods for generating hypothetical ellipses can be employed. The crystal monitoring system of FIG. 5B can advantageously use blob analysis to detect bright regions in the image and to determine the center of gravity, width, and height of each such region. Ellipse hypotheses that match these parameters are first tested with the ellipse gauging tool. If none of these hypotheses are verified, then hypotheses are generated randomly over a bounded three-dimensional parameter space (a,b,y0) that reflects the range of positions and sizes of elliptical projections that circular cross-section of solids of revolution are expected to produce based on the part-type under inspection. Once the elliptical projection of a circular cross-section of a solid of revolution is found in the image, the ellipse gauging tool proceeds to track changes in the ellipse parameters over time as described in the previous paragraph.

The overall operation of the invention is summarized in FIG. 10. First, an image is acquired of a portion of the circular cross-section of a solid of revolution (126). Then, in step (128), the image is analyzed to find a set of points on the boundary of the elliptical projection of the circular cross-section assumed to be visible on the surface of a part that has the form of a solid of revolution. In the next step (130), these points are then used to estimate the parameters a, b, and y0 of the ellipse that minimizes the fitting error in the minimum means squared error sense. Then, in step (132), these parameters are then used as inputs to Equation (2) above to derive the physical radius of the circular cross-section of the solid of revolution, as well as its position along the central axis of the solid of revolution. Repeating such measurements at many locations along the full length of the solid of revolution, one generally obtains a radius profile as in the case of the general radial profile inspection system, or a time-varying radius and melt level of a semiconductor crystal, as in the specialized case of a crystal growth inspection system.

Figure 7:
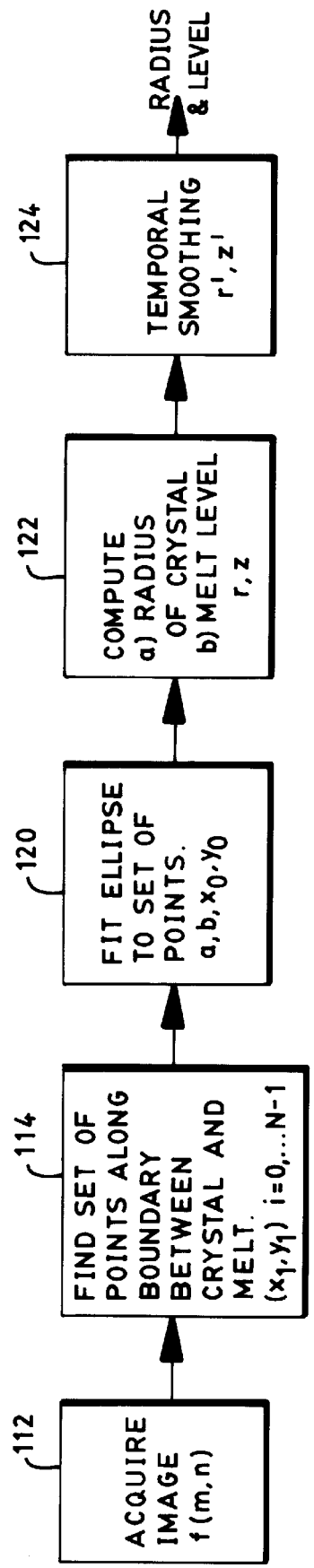
FIG. 7 is a top-level flow chart of the method of the invention specialized to monitoring semiconductor crystal growth.

FIG. 7 shows the embodiment of the invention that is specialized to monitor a growing semiconductor crystal as it is pulled from a melt. First, an image of the meniscus at the base of the growing crystal is acquired (112). Then, a set of points is found along the image of the meniscus using a plurality of edge tools 116, as described above. Next, a numerical optimization procedure, such as a least squares fit of the equation of an ellipse to the set of points is performed (120), thereby outputting a set of ellipse parameters a,b, y0. Then, the instantaneous radius of the crystal at the meniscus, and the melt level are computed using Eq. 2 above. Optionally, temporal smoothing can be performed over a sequence of such acquired images.

In general, it can be useful to temporally smooth the estimates obtained from multiple image acquisitions to reduce the effects of measurement noise. For example, with regard to crystal growth, recall that the crystal is generally suspended by a cable. Therefore, it can wobble and/or oscillate slightly in a pendulum-like fashion. Also, the edge data that the elliptical fits are based on contain some noise. Therefore, the preferred implementation of the system of the invention averages the instantaneous crystal radius and melt level estimates over a configurable number of recently acquired images before reporting the smoothed melt level and crystal radius estimate. In the crystal inspection system, this averaging operation takes the form of a standard moving average filter. In particular, the current reported value Vi, for the ith acquired image is obtained as a weighted sum of the measurement Mi from the current image and the previous reported estimate Vi−1 as follows:

$$Vi = (1-wt)*vi-1 + wt*Mi,$$

where wt is a constant between 0 and 1 which is chosen to produce the desired amount of temporal smoothing.

The radius profile monitoring system of the invention is widely applicable to situations that involve non-contact dimensional measurements of solids of revolution. Because the system of the invention takes into account the geometry of central projection, the invention allows great freedom in camera placement, viewing angle, and selection of lenses.

The procedure used for fitting an ellipse to a set of points involves first solving a system of four linear equations whose coefficients are computed from the set of point coordinates. The solution of the linear system is then used in a set of nonlinear equations to derive the parameters of the ellipse including the center point (x0, y0) and the major and minor axis lengths a, and b. The ellipse fitting problem and its minimum mean square error solution will now be described in detail below.

The equation of an ellipse is:

$$\frac{(x-x0)^2}{a^2} + \frac{(y-y0)^2}{b^2} = 0$$

or equivalently, $$x^2 + c1*x + c2*y^2 + c3*y + c4 = 0.$$

where $$c1 = -2*x0$$

$$c2 = a^2/b^2$$

$$c3 = 2*(a^2/b^2)*y0$$

$$c4 = x0^2 + (a^2/b^2)*y0^2 - a^2.$$

Given n points (xi, yi), we define the squared error (q) as:

$$q = \mathop{SUM}_{i=1}^{n} (xi^2 + c1*xi + c2*yi^2 + c3*yi + c4)^2$$

The minimum of q is obtained by solving for constants c1, c2, c3, c4 that satisfy the normal equations:

$$0 = \frac{d(q)}{d(c1)} = 2SUM[xi*(xi^2 + c1*xi + c2*yi^2 + c3*yi + c4)]$$

$$0 = \frac{d(q)}{d(c2)} = 2SUM[yi^2*(xi^2 + c1*xi + c2*yi^2 + c3*yi + c4)]$$

$$0 = \frac{d(q)}{d(c3)} = 2SUM[yi*(xi^2 + c1*xi + c2*yi^2 + c3*yi + c4)]$$

$$0 = \frac{d(q)}{d(c4)} = 2SUM[(xi^2 + c1*xi + c2*yi^2 + c3*yi + c4)]$$

where d(q)/d(ci) denotes partial differentiation of q w.r.t. ci.

The above set of simultaneous equations in four unknowns is written in matrix form as:

$$\begin{bmatrix} SUM\ xi^2 & SUM\ xi*yi^2 & SUM\ xi*yi & SUM\ xi \\ SUM\ xi*yi^2 & SUM\ yi^4 & SUM\ yi^3 & SUM\ yi^2 \\ SUM\ xi*yi & SUM\ yi^3 & SUM\ yi^2 & SUM\ yi \\ SUM\ xi & SUM\ yi^2 & SUM\ yi & n \end{bmatrix} \begin{bmatrix} c1 \\ c2 \\ c3 \\ c4 \end{bmatrix} = \begin{bmatrix} -SUM\ xi^3 \\ -SUM\ xi^2*yi^2 \\ -SUM\ xi^2*yi \\ -SUM\ xi^2 \end{bmatrix}$$

After solving for c1, c2, c3, c4, we next use these results to solve for the ellipse parameters using the following relations:

$$x0 = -c1/2$$

$$y0 = -c3/(2*c2)$$

$$a = sqrt(-c4 + c1^2/4 + c3^2/(4*c2))$$

$$b = sqrt((-c4 + c1^2/4 + c3^2/(4*c2))/c2)$$

Other modifications and implementations will occur to those skilled in the art without departing from the spirit and the scope of the invention as claimed. Accordingly, the above description is not intended to limit the invention except as indicated in the following claims.

APPENDIX

The procedure used for fitting an ellipse to a set of points involves first solving a system of four linear equations whose coefficients are computed from the set of point coordinates. The solution of the linear system is then used in a set of nonlinear equations to derive the parameters of the ellipse including the center point ($x_0$, $y_0$) and the major and minor axis lengths $a$, and $b$. The ellipse fitting problem and its minimum mean square error solution are described in detail below.

The equation of an ellipse is:

$$\frac{(x-x_0)^2}{a^2} + \frac{(y-y_0)^2}{b^2} = 0$$

-continued or equivalently, $$x^2 + c_1 \cdot x + c_2 \cdot y^2 + c_3 \cdot y + c_4 = 0.$$

where $$c_1 = -2 \cdot x_0$$
$$c_2 = a^2/b^2$$
$$c_3 - 2 \cdot (a^2/b^2) \cdot y_0$$
$$c_4 x_0^2 + (a^2/b^2) \cdot y_0^2 - a^2.$$

Given $n$ points $(x_i, y_i)$, we define the squared error $(q)$ as:

$$q = \sum_{i=1}^{n} (x_i^2 + c_1 \cdot x_i + c_2 \cdot y_i^2 + c_3 \cdot y_i + c_4)^2$$

The minimum of $q$ is obtained by solving for constants $c_1, c_2, c_3, c_4$ that satisfy the normal equations:

$$0 = \frac{\partial q}{\partial c_1} = 2 \cdot \sum_i [x_i \cdot (x_i^2 + c_1 \cdot x_i + c_2 \cdot y_i^2 + c_3 \cdot y_i + c_4)]$$

$$0 = \frac{\partial q}{\partial c_2} = 2 \cdot \sum_i [y_i^2 \cdot (x_i^2 + c_1 \cdot x_i + c_2 \cdot y_i^2 + c_3 \cdot y_i + c_4)]$$

$$0 = \frac{\partial q}{\partial c_3} = 2 \cdot \sum_i [y_i \cdot (x_i^2 + c_1 \cdot x_i + c_2 \cdot y_i^2 + c_3 \cdot y_i + c_4)]$$

$$0 = \frac{\partial q}{\partial c_4} = 2 \cdot \sum_i [(x_i^2 + c_1 \cdot x_i + c_2 \cdot y_i^2 + c_3 \cdot y_i + c_4)]$$

where $\frac{\partial q}{\partial c_i}$ denotes partial differentiation of $q$ with respect to $c_i$.

The above set of simultaneous equations in four unknowns is written in matrix form as:

$$\begin{bmatrix} \sum_i x_i^2 & \sum_i x_i \cdot y_i^2 & \sum_i x_i \cdot y_i & \sum_i x_i \\ \sum_i x_i \cdot y_i^2 & \sum_i y_i^4 & \sum_i y_i^3 & \sum_i y_i^2 \\ \sum_i x_i \cdot y_i & \sum_i y_i^3 & \sum_i y_i^2 & \sum_i y_i \\ \sum_i x_i & \sum_i y_i^2 & \sum_i y_i & n \end{bmatrix} \begin{bmatrix} c_1 \\ c_2 \\ c_3 \\ c_4 \end{bmatrix} = \begin{bmatrix} -\sum_i x_i^3 \\ -\sum_i x_i^2 \cdot y_i^2 \\ -\sum_i x_i^2 \cdot y_i \\ -\sum_i x_i^2 \end{bmatrix}$$

After solving for $c_1, c_2, c_3, c_4$, we next use these results to solve for the ellipse parameters using the following relations:

$$x_0 = -c_1/2$$

$$y_0 = -c_3/(2 \cdot c_2)$$

$$a = \sqrt{-c_4 + \frac{c_1^2}{4} + \frac{c_3^2}{4 \cdot c_2}}$$

$$b = \sqrt{\frac{1}{c_2}\left(-c_4 + \frac{c_1^2}{4} + \frac{c_3^2}{4 \cdot c_2}\right)}$$

What is claimed is:

1. A machine vision method for estimating both a longitudinal position and a radius of a circular cross-section of a solid of revolution, the method comprising the steps of:

acquiring an image of a circumferential feature of the solid of revolution using a camera having a focal length and disposed at a position characterized by a plurality of position parameters;

finding a set of points along the image of the circumferential feature;

determining an equation of an ellipse that substantially fits the set of points to provide a plurality of ellipse parameters; and computing the longitudinal position and the radius of the circular cross-section of the solid of revolution using the focal length, the plurality of position parameters, and the plurality of ellipse parameters.

2. The method of claim 1, where the step of finding a set of points along the image of the circumferential feature comprises the steps of:

creating a hypothetical ellipse at a location in the image;

creating a plurality of edge detection windows, each edge detection window located so as to include a portion of the hypothetical ellipse; and within each edge detection window, locating an edge so as to provide an edge position representing a point along the image of the circumferential feature.

3. The method of claim 1, wherein the step of determining an equation of an ellipse that substantially fits the set of points comprises the step of:

minimizing a fitting error using a numerical optimization technique.

4. The method of claim 3, wherein the numerical optimization technique is a technique that minimizes the square of the fitting error.

5. The method of claim 1, wherein the step of computing the longitudinal position and the radius of the circular cross-section of the solid of revolution further comprises the step of:

using only one of the major axis length and the minor axis length.

6. The method of claim 1, further comprising the step of:

repeating the previous steps to provide a plurality of recent longitudinal position values and radius values;

averaging the plurality of recent longitudinal position values and radius values to provide an average recent longitudinal position value and the average recent radius value;

periodically reporting the average recent longitudinal position value and the average recent radius value of the solid of revolution.

7. The method of claim 1, wherein the step of acquiring an image of a circumferential feature of the solid of revolution further comprises the step of:

first projecting structured light onto the surface of the solid of revolution so as to create the circumferential feature.

8. A machine vision method for estimating both a longitudinal position and a radius of a circular cross-section of a solid of revolution, the method comprising the steps of:

acquiring an image of a circumferential feature of the solid of revolution using a camera having a focal length and disposed at a position characterized by a plurality of position parameters;

finding a set of points along the image of the circumferential feature;

determining an equation of an ellipse that substantially fits the set of points to provide a plurality of ellipse parameters;

computing the longitudinal position and the radius of the circular cross-section of the solid of revolution using the focal length, the plurality of position parameters, and the plurality of ellipse parameters;

repeating the previous steps to provide a plurality of recent longitudinal position values and radius values;

averaging the plurality of recent longitudinal position values and radius values to provide an average recent longitudinal position value and the average recent radius value; and periodically reporting the average recent longitudinal position value and the average recent radius value of the solid of revolution.

9. The method of claim 1, where the step of finding a set of points along the image of the circumferential feature comprises the steps of:

creating a hypothetical ellipse at a location in the image;

creating a plurality of edge detection windows, each edge detection window located so as to include a portion of the hypothetical ellipse; and within each edge detection window, locating an edge so as to provide an edge position representing a point along the image of the circumferential feature.

10. A machine vision method for estimating both a melt level and a radius of a circular cross-section of a growing semiconductor crystal, the method comprising the steps of:

acquiring an image of a circumferential feature of the growing semiconductor crystal using a camera having a focal length and disposed at a position characterized by a plurality of position parameters;

finding a set of points along the image of the circumferential feature;

determining an equation of an ellipse that substantially fits the set of points to provide a plurality of ellipse parameters; and computing the longitudinal position and the radius of the circular cross-section of the semiconductor crystal using the focal length, the plurality of position parameters, and the plurality of ellipse parameters.

11. The method of claim 10, where the step of finding a set of points along the image of the circumferential feature comprises the steps of:

creating a hypothetical ellipse at a location in the image;

creating a plurality of edge detection windows, each edge detection window located so as to include a portion of the hypothetical ellipse; and within each edge detection window, locating an edge so as to provide an edge position representing a point along the image of the circumferential feature.

12. The method of claim 10, wherein the step of determining an equation of an ellipse that substantially fits the set of points comprises the step of:

minimizing a fitting error using a numerical optimization technique.

13. The method of claim 12, wherein the numerical optimization technique is a technique that minimizes the square of the fitting error.

14. The method of claim 10 wherein the step of computing the longitudinal position and the radius of the circular cross-section of the semiconductor crystal comprises the step of:

using only one of the major axis length and the minor axis length.

15. The method of claim 10, further comprising the step of:

repeating the previous steps to provide a plurality of recent longitudinal position values and radius values;

averaging the plurality of recent longitudinal position values and radius values to provide an average recent longitudinal position value and the average recent radius value;

periodically reporting the average recent longitudinal position value and the average recent radius value of the semiconductor crystal.

16. The method of claim 10, wherein the step of acquiring an image of a circumferential feature of the semiconductor crystal further comprises the step of:

first projecting structured light onto the surface of the semiconductor crystal so as to create the circumferential feature.

17. A machine vision method for estimating both a longitudinal position and a radius of a circular cross-section of a solid of revolution, the method comprising the steps of:

acquiring an image of a circumferential feature of the solid of revolution using a camera having a focal length and disposed at a position characterized by a plurality of position parameters;

finding a set of points along the image of the circumferential feature;

determining an equation of an ellipse that substantially fits the set of points to provide a plurality of ellipse parameters;

computing the longitudinal position and the radius of the circular cross-section of the solid of revolution using the focal length, the plurality of position parameters, and the plurality of ellipse parameters;

repeating the previous steps to provide a plurality of recent longitudinal position values and radius values;

averaging the plurality of recent longitudinal position values and radius values to provide an average recent longitudinal position value and the average recent radius value; and periodically reporting the average recent longitudinal position value and the average recent radius value of the solid of revolution.

18. The method of claim 17, where the step of finding a set of points along the image of the circumferential feature comprises the steps of:

creating a hypothetical ellipse at a location in the image;

creating a plurality of edge detection windows, each edge detection window located so as to include a portion of the hypothetical ellipse; and within each edge detection window, locating an edge so as to provide an edge position representing a point along the image of the circumferential feature.

* * * * *